United States Patent [19]

Barber et al.

[11] 4,212,082

[45] Jul. 8, 1980

[54] METHOD FOR FABRICATION OF IMPROVED STORAGE TARGET AND TARGET PRODUCED THEREBY

[75] Inventors: William D. Barber, Ballston Lake; George E. Possin, Schenectady, both of N.Y.

[73] Assignee: General Electric Company, Schenectady, N.Y.

[21] Appl. No.: 898,620

[22] Filed: Apr. 21, 1978

[51] Int. Cl.² .................... G11C 13/02; C25D 11/32
[52] U.S. Cl. .................................. 365/118; 204/38 A
[58] Field of Search .................. 204/38 A, 56 R; 365/118, 115, 128

[56] References Cited

U.S. PATENT DOCUMENTS

| | | | |
|---|---|---|---|
| 3,345,274 | 10/1967 | Schmidt | 204/38 A |
| 3,761,895 | 9/1973 | Ellis et al. | 365/118 |
| 3,764,491 | 10/1973 | Schwartz | 204/56 R |

Primary Examiner—John H. Mack
Assistant Examiner—William Leader
Attorney, Agent, or Firm—Geoffrey H. Krauss; James C. Davis; Marvin Snyder

[57] ABSTRACT

An improved target for storage of electric charge, in an electron beam addressable memory, utilizes an anodic oxide grown upon a semiconductor layer, forming part of a semiconductor diode structure. The anodic oxide is overlayed with a planar film of conductive material and the target structure is scanned with an electron beam for writing of electric charge storage therein and reading of the electron charge patterns therefrom over relatively greater numbers of erase/write operations relative to a target having a thermally-grown oxide layer.

15 Claims, 8 Drawing Figures

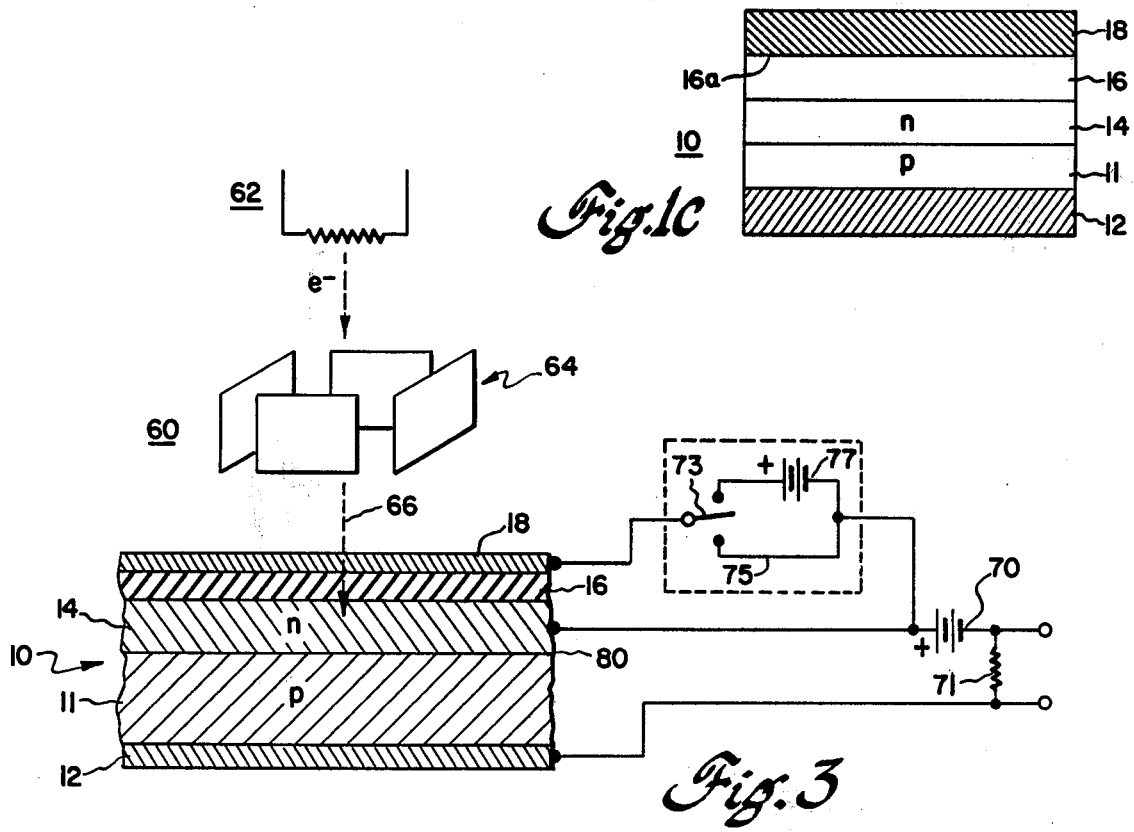

METHOD FOR FABRICATION OF IMPROVED STORAGE TARGET AND TARGET PRODUCED THEREBY

BACKGROUND OF THE INVENTION

The present invention relates to memory devices and, more particularly, to an electron-beam-addressed charge storage memory having an improved target for facilitating relatively greater numbers of erase/write operations.

Electron-beam-addressable memories utilizing a multi-layered memory target, particularly a target of the metal-oxide-semiconductor type, are well-known. One such target structure is disclosed and claimed in U.S. Pat. No. 3,761,895, entitled "Method and Apparatus for Storing and Reading Out Charge In an Insulating Layer", issued Sept. 25, 1973 and assigned to the assignee of the present invention. The target described in the aforementioned patent, incorporated herein by reference, allows binary data to be stored as a pattern of electrical charge written into the insulating oxide layer, by means of a modulated electron beam impingent thereon. The stored electrical charge patterns are read by scanning the electron beam across a desired area of the target to vary the current through a reverse-biased p-n junction underlying the oxide layer and in accordance with the presence or absence of a charge site in the latter. It has been found that memory target operation is somewhat degraded after the target receives an electron beam dose of a few coulombs per square centimeter, commensurate with a certain number of reading, writing and erasing operations. A target, of the metal-oxide-semiconductor type, which provides discernable differences in gain, during a reading operation, responsive to an area of the target having charge present or devoid thereat, even after electron beam dosages due to reading, writing and erasing in excess of 10 coulombs per square centimeter, is highly desirable.

BRIEF SUMMARY OF THE INVENTION

In accordance with the invention, an improved storage target of the metal-oxide-semiconductor type is fabricated by providing a generally planar semiconductor diode structure including a semiconductor substrate of a first polarity-type with a semiconductor layer of the remaining-polarity-type fabricated thereon, and anodizing the free surface of the semiconductor layer to form a layer of anodic semiconductor oxide, prior to fabrication of a film of conductive material upon the free surface of the anodic oxide. The thickness of the oxide is determined by the voltage current and growth media utilized in the anodization process, as well as the total anodization time. Anodic oxide growth is carried out at or near room temperature to remove thermal strain normally encountered in the growth of a thermal oxide.

In one preferred embodiment, the anodic oxide layer is grown in an electrolyte of N-methylacetamide and potassium nitrate ($KNO_3$) with an anodizing voltage of about 200 volts. The rapid anodization is terminated prior to the oxide attaining the saturation thickness for that voltage, with a final oxide thickness in the range of 1000–2000 Å and a preferable thickness not greater than 1400 Å. The preferred multilayer target provides useful gain-difference levels (written-charge and charge-devoid site gain differences) to a total fluence of at least 16 coulombs per square centimeter, and, if a particular storage site is accessed with a relatively low duty cycle, the anodic oxide is self annealing, whereby the gain difference for a particular site tends to return, with time, toward the original gain difference of the normal oxide, even after reception of relatively high electron beam fluence.

Accordingly, it is an object of the present invention to provide a novel multilayered electron-beam-addressable memory target having an anodic oxide layer.

This and other objects of the present invention will become apparent to those skilled in the art upon consideration of the following detailed description taken in conjunction with the accompanying drawings.

BRIEF DESCRIPTION OF THE DRAWINGS

FIGS. 1a, 1b and 1c are sectional side views illustrating the steps in fabricating a multilayered semiconductor target with an anodic oxide layer, in accordance with the principles of the present invention;

FIG. 2 is a somewhat schematic view of apparatus utilized for forming an anodic oxide layer upon the surface of a semiconductor planar diode;

FIG. 3 is a somewhat schematic illustration of the manner in which the anodic oxide target is utilized;

DETAILED DESCRIPTION OF THE INVENTION

Figure 4A:
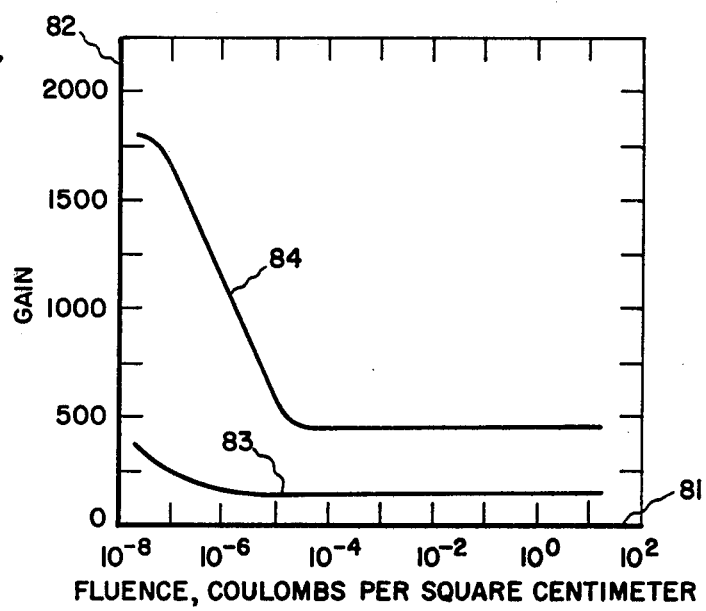
FIGS. 4a and 4b are gain-fluence graphs illustrating the behavior of an anodic oxide target and a thermal oxide target, respectively.

Referring initially to FIGS. 1a, 1b and 1c, a multilayered target 10 for use in an electron-beam-addressed memory, is provided by fabricating a planar diode 10' including a semiconductor substrate 11, of a first-polarity-type, e.g. p-type silicon, upon which may be fabricated a generally planar conductive support 12. A layer 14 of the semiconductor material and of the opposite-polarity type, e.g. n-type silicon, is fabricated upon that surface 11a of the semiconductor substrate 11 furthest from support 12 as shown in FIG. 1a.

A layer 16 of anodic oxide of the semiconductor material, utilized for substrate 11 and layer 14, is fabricated upon the generally planar surface 14a of semiconductor layer 14 furthest from semiconductor substrate 11, as shown in FIG. 1b.

A substantially planar layer 18 of a conductive material, such as aluminum and the like, is fabricated upon the surface 16a of the anodic semiconductor oxide, e.g. anodic silicon oxide ($SiO_2$), furthest from the planar diode structure including n-type semiconductor layer 14 and the supporting p-type semiconductor substrate 11, as shown in FIG. 1c.

Referring now to FIG. 2, the anodic oxide layer 16 is fabricated upon semiconductor layer surface 14a by placing the planar diode structure 10' of FIG. 1a into a retaining apparatus 20 generally formed of an inert material, such as a nonconductive plastic and the like. Holding apparatus 20 includes a backing portion 21 having a flat surface 21a supporting the conductive layer 12 in such manner that the semiconductor substrate 11 and semiconductor layer 14 are sequentially arranged away from surface 21a. Embedded within holding apparatus portion 21 is a conductive contact 23 urged, by means of a conductive spring 25, against the surface of conductive support layer 12. A conductive lead 27 is attached to conductive spring 25 to form an anode connection. A holding apparatus cap 29 fits over the planar semiconductor diode structure 10' and is fastened, by means not shown for purposes of simplicity, to holding assembly bottom portion 21 to maintain the semiconductor diode in electrical contact against contacting piece 23 and firmly in position. Holding assembly portion 29 includes an aperture 29a configured to expose that portion of semiconductor layer surface 14a upon which the anodic oxide is to be grown. The semiconductor diode structure 10' and its holding assembly 20 are submerged in a quantity of electrolytic fluid 35 maintained within a beaker 36 of substantially transparent, nonconductive material. At least a portion of a cathode electrode 38, formed of a non-reactive material such as platinum and the like, is positioned within electrolytic fluid 35. A potential source 40 is connected in electrical series connection with a current meter 42 and a switch means 44, between cathode 38 and anode lead 27. A light source 50 is preferably arranged to project a photon stream 52 upon, and substantially normal to, the semiconductor layer surface 14a exposed to the electrolytic fluid to enhance anodic oxide production by causing formation of electron-hole pairs, in known manner, at the oxide-electrolyte interface.

In a presently preferred embodiment, electrolyte 35 is a solution of potassium nitrate ($KNO_3$) and N-methylacetamide, although other electrolytes such as diethylene glycol or $HNO_3$ may also be utilized. The potential of source 40 is established with positive polarity to anode lead 27 and with a magnitude preferably being at least 200 volts. Upon closure of switch means 44, a layer 16 of anodic silicon dioxide begins to form upon the exposed semiconductor layer surface 14a. The thickness T (see FIG. 1b) of this layer is dependent upon the voltage of potential source 40, the current (measured by meter 42) between cathode 38 and anode lead 27, the type of electrolyte 35, the intensity of photon illumination 52 and the time during which anodic growth is carried out. Preferably, the anodic oxide layer 16 is grown to thickness T of between about 1000 and 2000 Å. We presently prefer an oxide thickness of not greater than 1400 Å. Assuming all of the variables are held constant, the oxide thickness may be controlled by coupling a constant voltage between cathode 38 and anode lead 27 and controlling the time during which anodic oxide growth occurs. Alternatively, a constant growth time may be utilized with the growth potential of source 40 being adjusted to achieve the desired thickness at the end of the constant time interval. We have found that due to the relatively rapid oxide growth with high potential voltages, e.g. greater than 200 volts, we prefer to establish a potential yielding a saturation thickness, i.e. the total thickness of the oxide layer grown for a particular voltage for very long anodization time intervals, somewhat greater than the desired thickness of anodic oxide layer 16, and to control the time interval to terminate prior to reaching this saturation thickness and at the desired thickness T. Typically, the growth of anodic oxide is most rapid at commencement of oxide growth with growth slowing down as a thicker oxide layer is built up. Typical anodization times are on the order of 10-60 minutes with substantially no difference in oxide quality being found for current densities between about 2 and 10 milliamperes per square centimeter. Advantageously, the anodic oxide is grown with ambient temperature at or near room temperature; in contrast, thermal growth of a silicon dioxide layer typically requires heating the semiconductor diode structure 10' to a temperature in the region of 1000° C., prior to cooling the planar diode-with-thermal oxide layer back to room temperature. Thus, a thermally grown oxide layer will have a substantially constant amount of thermal strain, dependent upon the thermal-growth temperature, whereas the strain in the anodic oxide is dependent upon the anodic growth conditions and may be substantially reduced, in known manner, relative to the strain in the thermally grown oxide.

The oxide layer in our preferred target of 1 cm.$^2$ is grown by connecting a resistance 55 of about 100 kilohms in series with the potential source 40 of about 500 volts magnitude, whereby the initial voltage between anode lead 27 and cathode 38 is about 75 volts with an initial current of about 4 milliamperes/cm.$^2$. The anodization proceeded for about one hour with a final voltage between anode lead 27 and cathode electrode 38 of about 300 volts and a final current of about 1.5 milliamperes/cm.$^2$.

Referring now to FIG. 3, target 10 is utilized in an electron-beam-addressed memory system 60 including an electron-beam-emitting "gun" structure schematically shown as element 62 and means 64 for deflecting the electron beam 66 to a particular site upon the surface of conductive layer 18. A first potential source 70 is in electrical series connection with a load resistance 71, between semiconductor layer 14 and semiconductor substrate 11 (via connection to the conductive layer 12 underlying the semiconductor substrate). For the preferred n-type semiconductor layer 14 and p-type semiconductor layer 11, potential source 70 has its positive pole connected to the semiconductor layer 14. An output signal is derived across load resistor 71.

The top conductive layer 18 is connected, via a single-pole, double throw switch means 73 to one of a short circuit 75 to semiconductor layer 14 or a second potential source 77 having its positive pole connectable via switch 73 to the conductive layer 18 and its negative pole connected to semiconductor layer 14.

In operation, target 10 is erased by moving switch means 73 to its lower position, coupling short circuit 75 between conductive layer 18 and semiconductor layer 14, and thence scanning the electron beam across the entire target surface portion to be erased. It should be understood that a negative voltage may be coupled in lieu of short circuit 75 to conductive layer 18, with respect to semiconductor layer 14 to erase the target; a negative voltage in the range of −30 to −40 volts generally suffices. Data is written into the target as patterns of stored charge by coupling second potential means 77, via switch means 73, to conductive layer 18 with positive polarity, with respect to semiconductor layer 14. Impingement of the electron beam at a particular site, in the two-dimensional array of potential storage sites on the planar surface of the target, causes charge storage within the anodic oxide, while blanking of the beam to prevent impingement provides a potential storage site devoid of stored charge. The charge storage condition is advantageously referred to as a logic "one" while the charge-devoid condition is advantageously referred to as a logic "zero". During the writing operation, it is possible to obtain information relative to the condition of charge storage by monitoring the signal across load resistance 71, which signal has a relatively high value when the electron beam 66 impinges at a data site and provides a current through the reverse-biased junction 80 between semiconductor layer 14 and semiconductor substrate 11.

Data is read from the target by scanning the portion of the target containing the desired data with the electron beam while maintaining the positive potential on conductive layer 18 with respect to semiconductor layer 14. Typically, the voltage of second potential source 77 is in the range of about 30 to about 40 volts. Relatively high voltage across load resistance 71, due to relatively high current, caused by the gain across the reverse-biased semiconductor junction 80, is displayed when a site having charge stored thereat is read with the electron beam; a relatively low current, and relatively low voltage across load resistor 71, are developed when the electron beam reads a site devoid of stored charge.

Thus, relative to the thermal oxide target disclosed and claimed in the aforementioned U.S. patent, the anodic oxide target is erased with substantially a zero voltage potential, rather than a negative potential; is read with a positive potential between conductive layer 18 and semiconductor layer 14, rather than the substantially zero voltage potential of the target of the patent; and both targets are written with positive oxide-layer bias. Further details concerning the writing, reading and erase operations may be found by reference to the aforementioned patent.

Figure 4B:
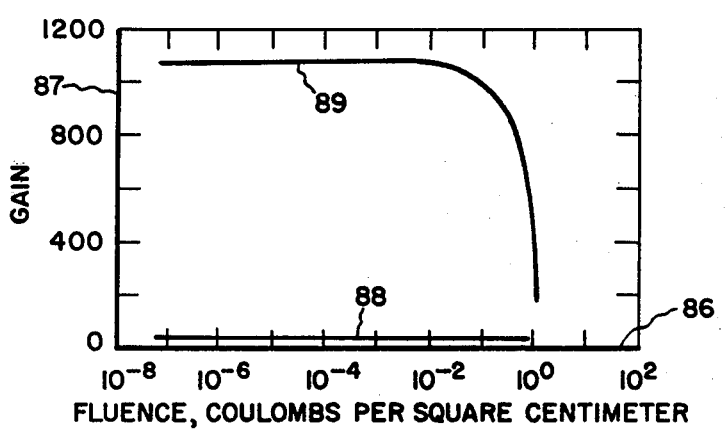

Referring now to FIGS. 4a and 4b, the target gain for charge present (logic "one") sites and charge-devoid (logic "zero") sites is plotted with respect to total electron beam fluence, for respectively, the anodic oxide target of the present invention and the thermal oxide target of the aforementioned U.S. patent. In FIG. 4a, the abscissa 31 is scaled in coulombs per square centimeter units of total beam fluence, due to previous reading, writing and erasing operations, while ordinate 82 is scaled in units of grain; curve 83 is the gain (electrons flowing through load resistance 71) (FIG. 3) for each electron in beam 66 impinging upon the anodic oxide target) for a charge-devoid, logic "zero" site, and curve 84 is the gain for a charge-bearing, logic "one" data site. It will be observed that, although the absolute gains tend to relatively rapidly decrease for relatively low total fluence, a discernable (and substantially constant) gain difference is nevertheless present, for relatively high maximum electron beam dosage to in excess of 10 coulombs per square centimeter. In the preferred target illustrated, the target experiences relatively rapid damage, for relatively low numbers of read operations after a single writing operation, with the primary damage mechanism believed to be an increase in interface state density. We believe that the amount of interface state density increase, with electron-beam irradiation, is determined by the structure and chemical composition of the insulator, within a tunneling distance (approximately 30 Å) from the oxide-semiconductor layer interface, and with the increased interface state density tending to increase the surface recombination velocity for a given value of stored charge. The anodic semiconductor oxide layer, after undergoing initial damage, apparently tends to undergo no additional damage out to the maximum electron beam dose which is about 16 coulombs per square centimeter in the target graphically illustrated in FIG. 4a.

In FIG. 4b, the total beam fluence, for an increasing number of read operations after a single writing operation, for a target with thermally grown oxide layer, is plotted along abscissa 86, with the target gain plotted along ordinate 87. Curve 88 illustrates the charge-devoid, logic "zero" gain of a storage site in the thermally-grown oxide target, and curve 89 illustrates the gain of the charge-present, logic "one" data site in the same target. It will be seen that initial damage is apparently not present, whereby the ratio of gains for the charge-present to charge-devoid conditions are somewhat greater than for the anodic-oxide target, but that the useful number of reading, writing and erasing operations, is limited to a total beam fluence on the order of 1 coulomb per square centimeter. Typically, about $10^{-7}$ coulomb/cm.$^2$ is required for each erase or write operation and about $10^{-8}$ coulomb/cm.$^2$ is required for each read operation. Hence, 10 coulomb/cm.$^2$ represents about $5 \times 10^7$ erase/write operations or about $10^9$ read operation. Thus, the use of an anodic oxide target provides the unexpected ability to realize reading operations of approximately 2 orders of magnitude greater in number, after a single writing operation, than a thermal-oxide target of substantially similar design.

Figure 5:
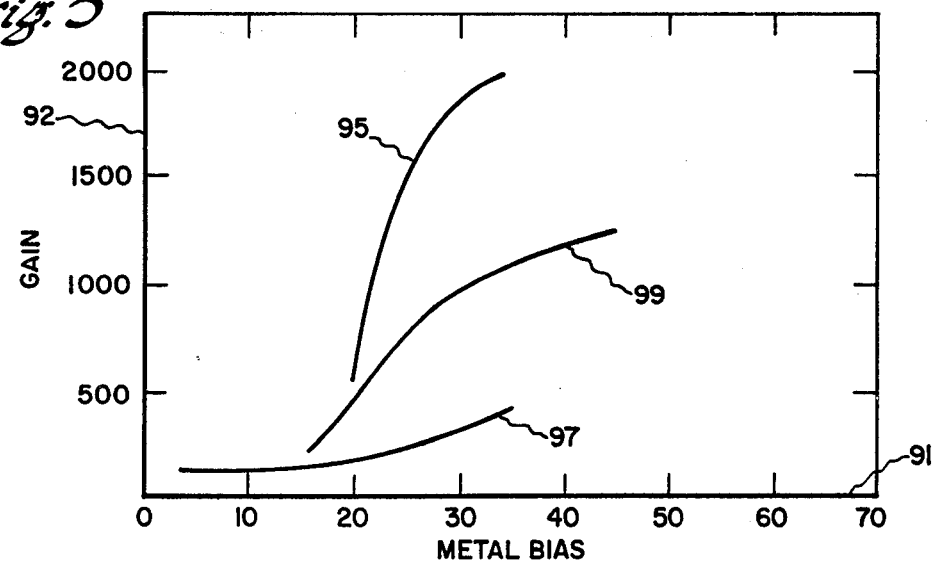
FIG. 5 is a graphic illustrating of the self-annealing properties of the anodic target produced by the method of the present invention.

Referring now to FIG. 5, in which the value of metal bias (the bias potential between conductive, and preferably metallic, layer 18 (FIG. 3) and semiconductor layer 14, during the reading operation) is plotted for positive metal biases along abscissa 91, with gain being plotted in absolute units along ordinate 92. Curve 95 illustrates the gain behavior with respect to bias of an undamaged target, i.e. an anodic oxide target subjected to relatively few read, write and erase operations, for a range of positive biases (+20 to +35 volts) at an electron-beam landing potential of about 10 KeV. Curve 97 illustrates the gain for the same target, at the same electron-beam landing potential, over a metal bias range from about 5 to about 35 volts, positive with respect to semiconductor layer 14, immediately after a sufficient number of reading operations have been carried out to subject the anodic oxide target to a total beam fluence on the order of 16 coulombs per square centimeter. Curve 99 illustrates the gain with metal bias variation over the bias range of about +15 to about +45 volts, when the same target has been stored for about 100 hours at room temperature. It will be seen that the gain, after about 100 hours of storage, has significantly increased for normal read-bias voltages, on the order of +30 to +40 volts, over the gains exhibited immediately after the relatively high electron-beam fluences encountered during the multiplicity of read operations. Apparently, room-temperature (about 25° C.) annealing of the damage to the oxide layer-semiconductor layer interface occurs to facilitate the increase in gain. Thus, we expect that, because a particular data storage site is generally not continuously read, erased or written on each data-retrievable operation from a data-storage memory, room-temperature annealing of interface defects will occur on a continuing basis between operations, whereby the total number of operations at a particular data storage site will increase by even more than the two orders of magnitude, shown by FIGS. 4a and 4b, relative to a thermal-oxide target.

There has just been described a method for fabricating an improved storage target, having an anodic oxide layer, for use in electron-beam-address memories and the like, wherein the improved target facilitates an increased number of reading operations, after a single data-writing operation, without decrease in the ratio of target output current for charge-present to charge-devoid data sites, and with a self-annealing property.

While the present invention has been described with respect to one preferred embodiment thereof, many variations and modifications will now occur to those skilled in the art. It is our intent, therefore, to be limited only the scope of the appending claims and not by the specific embodiment discussed herein.

What is claimed is:

1. A method for fabricating a charge-storage target, comprising the steps of:
   (a) providing a target of silicon semiconductor material of a first polarity-type;
   (b) fabricating a semiconductor layer of silicon of an opposite polarity-type, upon a surface of the semiconductor substrate;
   (c) providing an electrolyte initially in contact with a portion of the surface of said semiconductor layer, opposite said substrate, upon which an anodic oxide layer is to be grown and thence in contact with the surface of said anodic oxide during growth;
   (d) selecting the electrolyte to be one of diethylene glycol, $HNO_3$, and a mixture of potassium nitrate and N-methylacetamide;
   (e) providing a cathode at least partially immersed in the electrolyte;
   (f) providing an anode contact to the semiconductor substrate;
   (g) utilizing a final anodizing potential of at least 200 volts to cause a flow of current from the anode connection through the electrolyte to the cathode to anodize the surface of the semiconductor layer, opposite the junction between the semiconductor layer and substrate and form a layer of anodic silicon oxide thereon; and
   (h) fabricating a layer of conductive material upon the surface of the anodic silicon oxide.

2. The method as set forth in claim 1, wherein said anodic silicon oxide layer is fabricated to a thickness of between about 1000 Å and about 2000 Å.

3. The method as set forth in claim 2, wherein the anodic silicon oxide layer is fabricated to a thickness of about 1400 Å.

4. The method as set forth in claim 1, wherein anodization takes place over a time interval of between about 10 and about 60 minutes.

5. The method as set forth in claim 1, wherein the current flow is between about 2 and about 10 milliamperes for each square centimeter of semiconductor layer surface being anodized.

6. The method as set forth in claim 1, wherein the anodizing step (g) occurs at a temperature of about 25° C.

7. The method as set forth in claim 1, wherein said anodizing step (g) is carried out over a time interval less than the time interval necessary to achieve a saturation thickness of anodic oxide for a particular anodizing voltage being utilized.

8. A semiconductor target of the charge-storage type, fabricated by the method as set forth in claim 1.

9. The semiconductor target set forth in claim 8, further comprising a conductive contact layer fabricated upon the surface of the semiconductor substrate opposite from the semiconductor layer.

10. The semiconductor target set forth in claim 8, wherein said semiconductor substrate is p-type silicon and said semiconductor layer is n-type silicon.

11. The semiconductor target of claim 8, in combination with first means for reverse-biasing the junction between said semiconductor substrate and said semiconductor layer; and means for selectively biasing said layer of conductive material with respect to said semiconductor layer.

12. The combination as set forth in claim 11, wherein said selective biasing means comprises a first potential source for biasing said conductive layer positive with respect to said semiconductor layer; a second potential source for biasing said conductive layer at one of a zero potential and a negative potential with respect to said semiconductor layer; and switch means for connecting said first or said second potential sources between said conductive layer and said semiconductor layer for writing electric charge into a data site of said target and for reading the presence or absence of stored electric charge at said data site, responsive to impingement of an electron beam upon said data site.

13. The combination as set forth in claim 12, wherein said first potential source supplies a voltage of between about 30 and about 40 volts with a positive polarity to said conductive layer, with respect to said semiconductor layer.

14. The combination as set forth in claim 12, wherein said second potential source supplies a voltage of approximately zero volts between said conductive layer and said semiconductor layer.

15. The combination as set forth in claim 12, wherein said second potential source provides a voltage of about −30 volts to about −40 volts at said conductive layer, with respect to said semiconductor layer.

* * * * *